United States Patent [19]

Landi

[11] Patent Number: 4,940,949
[45] Date of Patent: Jul. 10, 1990

[54] HIGH EFFICIENCY HIGH ISOLATION AMPLIFIER

[75] Inventor: Ernest D. Landi, Milipitas, Calif.

[73] Assignee: Avantek, Inc., Milpitas, Calif.

[21] Appl. No.: 430,629

[22] Filed: Nov. 1, 1989

[51] Int. Cl.$^5$ .............................................. H03F 3/30
[52] U.S. Cl. ..................................... 330/262; 330/271; 330/311
[58] Field of Search .................. 330/70, 71, 262, 271, 330/273, 311

[56] References Cited

U.S. PATENT DOCUMENTS

| | | | |
|---|---|---|---|
| 2,943,267 | 6/1960 | Randise | 330/311 |
| 3,376,515 | 4/1968 | Dilley | 330/270 |
| 3,995,228 | 11/1976 | Pass | 330/265 |
| 4,041,408 | 8/1977 | Trotnick, Jr. | 330/84 X |
| 4,042,887 | 8/1977 | Mead et al. | 330/53 |
| 4,250,463 | 2/1981 | Foster | 330/298 |
| 4,254,379 | 3/1971 | Kawanabe | 330/268 |
| 4,752,745 | 6/1988 | Pass | 330/265 |

FOREIGN PATENT DOCUMENTS 2746745  4/1979  Fed. Rep. of Germany ...... 330/311

*Primary Examiner*—James B. Mullins
*Attorney, Agent, or Firm*—Philip M. Shaw, Jr.

[57] ABSTRACT

A broadband RF amplifier with high efficiency and high reverse isolation having a common emitter stage connected in a cascode configuration to a common base stage, said cascode driving the common base stage in a push-pull operation with a common collector stage.

11 Claims, 4 Drawing Sheets

HIGH ISOLATION AMPLIFIER

HIGH FREQENCY EQUIVALENT
OF FIG. 2

HIGH
REVERSE ISOLATION
AMPLIFIER

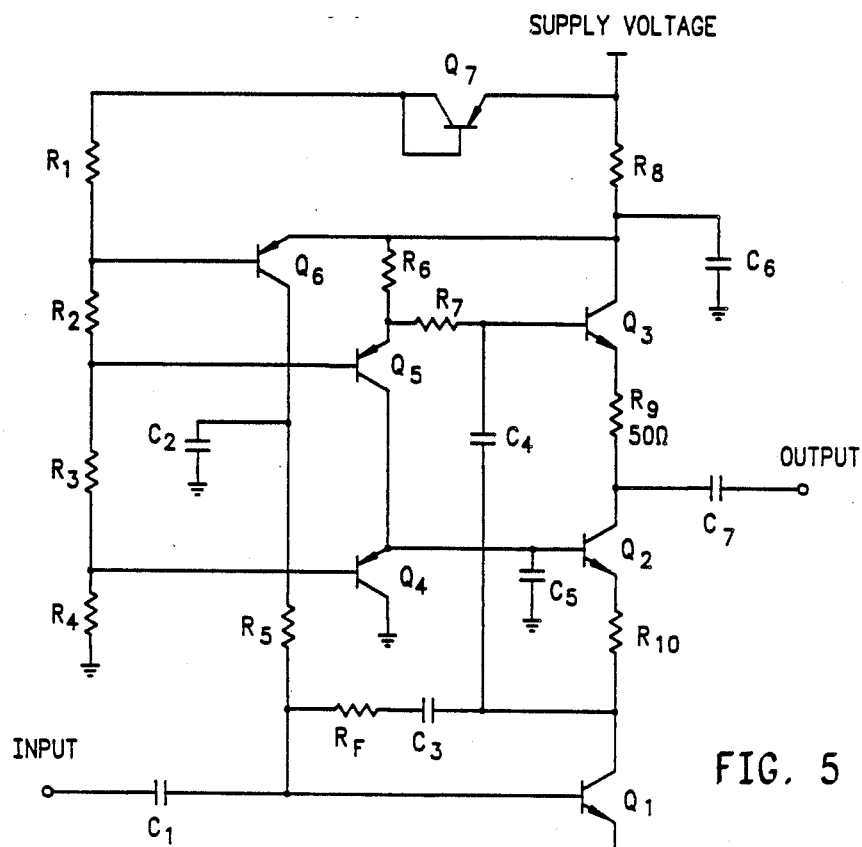
FIG. 5
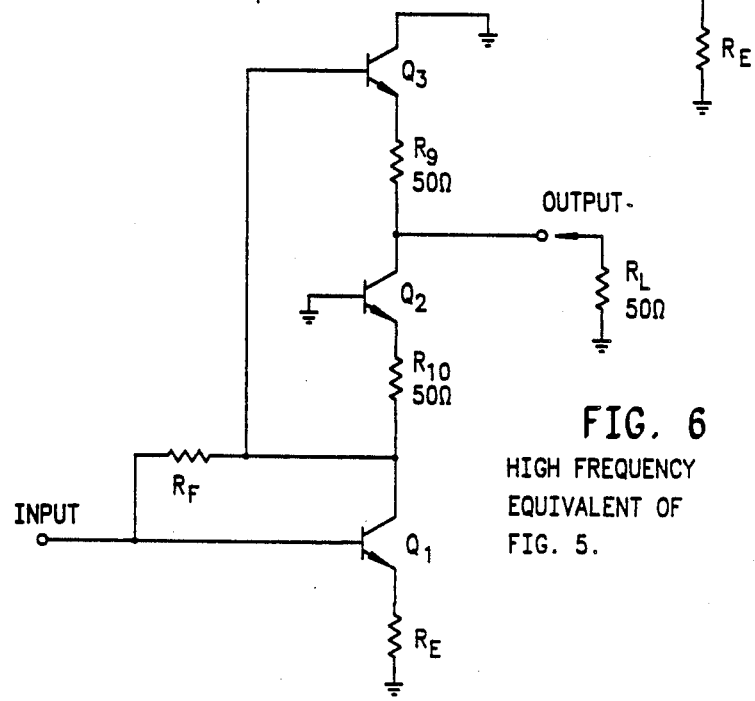
FIG. 6
HIGH FREQUENCY
EQUIVALENT OF
FIG. 5.

HIGH EFFICIENCY HIGH ISOLATION AMPLIFIER

BACKGROUND OF THE INVENTION

1. Field of the Invention

The present invention relates to a class of high isolation broadband amplifiers and more particularly to increasing the efficiency of a broadband amplifier without adversely affecting its bandwidth or reverse isolation characteristics.

2. Discussion of the Prior Art

In the design of broadband amplifiers, feedback is typically used to increase bandwidth and optimize high frequency response. However, simple shunt feedback causes the amplifier to have low isolation (the suppression of a signal applied at the output port as measured at the input port). This can cause unwanted parasitic cross-coupling between the input and output circuits.

One way of providing feedback while maintaining high isolation is to use ferrite directional couplers, as disclosed in U.S. Pat. No. 4,042,887. See FIG. 1. However, the bandwidth of the amplifier is limited by the bandwidth of the ferrite couplers. Also, the ferrite couplers are relatively expensive.

A broadband high isolation amplifier which avoids ferrite couplers is shown in FIG. 2, and its high frequency equivalent is shown in FIG. 3. Transistors $Q_3$ and $Q_4$, and resistors $R_1$ through $R_5$ constitute the bias circuit. All capacitors are bypass (blocking) capacitors. Resistor $R_6$ sets the output impedance at 50 ohms to match the load. The collector current of $Q_2$ is split between $R_6$ and the load, and it is proportional to and in phase with the load current. Ignoring base currents, the current through $R_7$ is therefore proportional to the load current, and the voltage across it is proportional to the output voltage. This voltage across $R_7$ is used to apply feedback to the base of $Q_1$. The high isolation of this amplifier is realized by the inherent isolation of $Q_2$ in the common base configuration and by not sampling the feedback voltage from across the load.

Since $R_6$ is in parallel with the load, only half of $Q_2$'s collector current is available for the load, making the amplifier perform with only moderate efficiency. The prior art technique for improving the efficiency of this circuit is shown in FIG. 4. A transformer $T_1$ with a four to one turn ratio is placed across $R_6$, whose resistance is increased to 200 ohms so as to match the load impedance. Transistor $Q_2$'s collector current is still split between $R_6$ and the load resistance so that only half of $Q_2$'s collector current is available for the load. However, the transformer steps this up by a factor of two so that the load current is equal to $Q_2$'s collector current. Transformers have the same drawback as ferrite couplers, However, in that they decrease the bandwidth of the amplifier. A transformer with a higher turn ratio, so as to further increase the efficiency of the amplifier, would decrease the bandwidth even more.

SUMMARY OF THE INVENTION

It is an object of this invention to provide an improved broadband RF amplifier. More specifically, it is an object of this invention to provide an RF amplifier with high efficiency. It is another object of this invention to provide an RF amplifier with high reverse isolation and broad bandwidth. Yet another object of this invention is to provide an RF amplifier which is relatively inexpensive to manufacture.

These and other objects can be accomplished according to the present invention of a broadband RF amplifier comprising a common emitter stage in a cascode configuration with a common base stage, and a common collector stage connected to the cascode so as to be driven by the common emitter stage in push-pull with the common base stage.

BRIEF DESCRIPTION OF THE DRAWINGS

FIG. 5 is a circuit schematic of an embodiment of the present invention.

FIG. 6 is a circuit schematic of the high frequency equivalent of the circuit of FIG. 5.

DETAILED DESCRIPTION OF THE INVENTION

Figure 1:
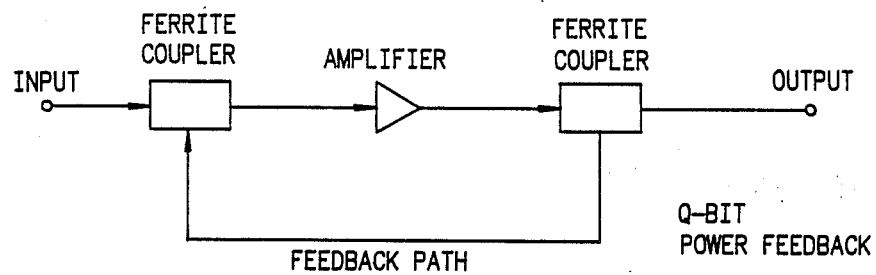
FIG. 1 is a diagram of a conventional high isolation amplifier.
Figure 2:
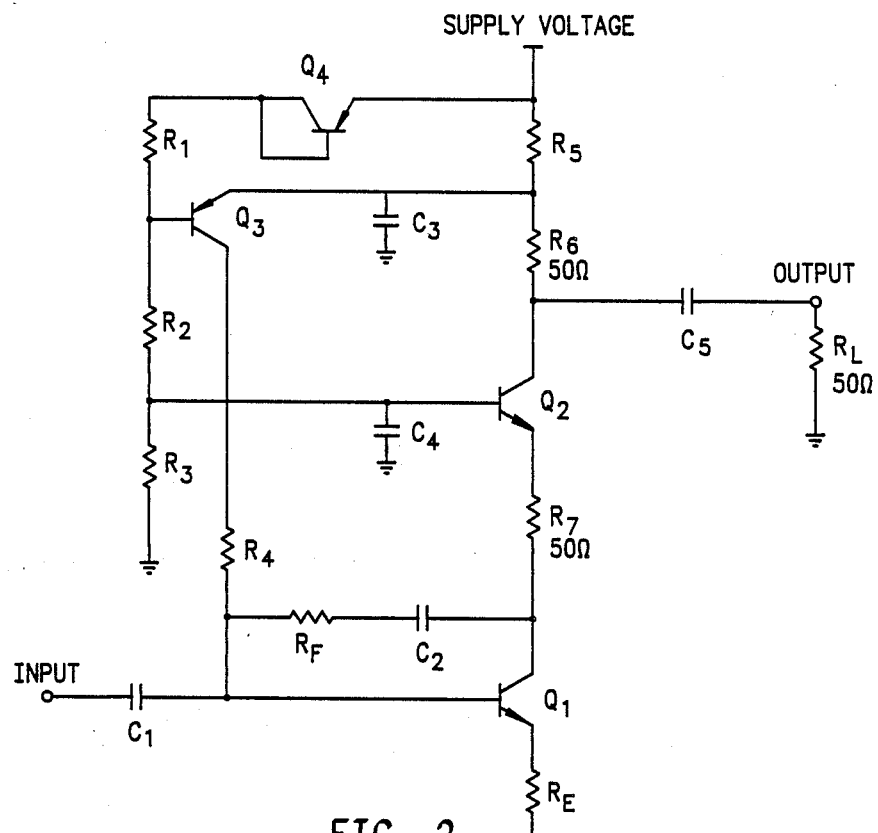
FIG. 2 is a circuit schematic of a conventional high isolation amplifier without ferrite couplers.
Figure 3:
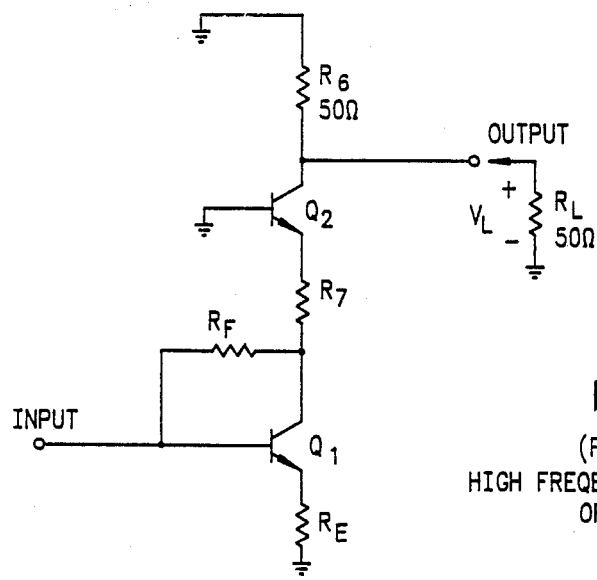
FIG. 3 is a circuit schematic of the high frequency equivalent of the circuit of FIG. 2.

A schematic diagram of an amplifier according to the present invention as described below is shown in FIG. 5. Transistors $Q_4$-$Q_7$, and resistors $R_1$-$R_8$ constitute the bias circuit. Capacitors $C_1$-$C_7$ are bypass (blocking) capacitors. The emitter of transistor $Q_3$ is a low impedance node. Resistor $R_9$ therefore sets the output impedance. Resistor $R_9$ also acts as a voltage divider for reverse signal transmission in that an extremely small portion of the reverse signal is applied to the emitter of transistor $Q_3$ so that the path has high isolation. The path through the collector of transistor $Q_2$ has high isolation as in FIG. 3. Feedback is achieved in the same manner as in FIG. 3. The AC operation of the circuit is best described with reference to FIG. 6, where transistors $Q_2$ and $Q_3$ operate in push pull, i.e., the load current is the sum of $Q_2$'s collector current and $Q_3$'s emitter current. If resistors $R_9$ and $R_{10}$ are both equal to the load resistance, then transistor $Q_2$'s collector current equals the load current. This can be verified inductively. Ignoring base currents, the current through resistor $R_{10}$ has the same amplitude and phase as the load current. The AC voltage at the collector of transistor $Q_1$ is therefore equal in amplitude and phase to the voltage at the collector of transistor $Q_2$. Since transistor $Q_3$ is an emitter-follower and is being driven by the voltage at the collector of transistor $Q_1$, no voltage is applied across resistor $R_9$'s nodes. This verifies that the collector current of transistor $Q_2$ is equal in amplitude and phase to the load current.

Figure 4:
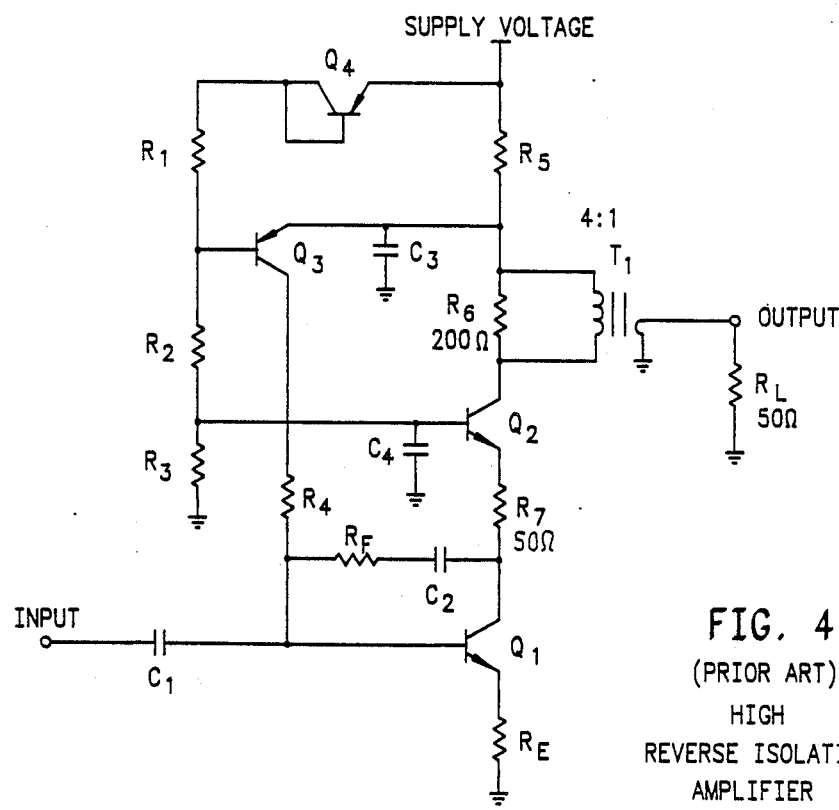
FIG. 4 is a circuit schematic of a conventional high isolation amplifier with increased efficiency.

Thus, the circuit of the present invention has the same efficiency as the circuit of FIG. 4, but without the adverse bandwidth effects of the transformer. Furthermore, if resistor $R_9$ is increased to a value larger than the load resistance, the voltage at transistor $Q_3$'s emitter will be larger than the voltage across the load. This will result in a voltage across resistor $R_9$, but the polarity is such as to add to the current supplied by transistor $Q_2$. This increases the efficiency even further, with far less adverse effect on the amplifier's bandwidth than a transformer would have.

Figure 7:
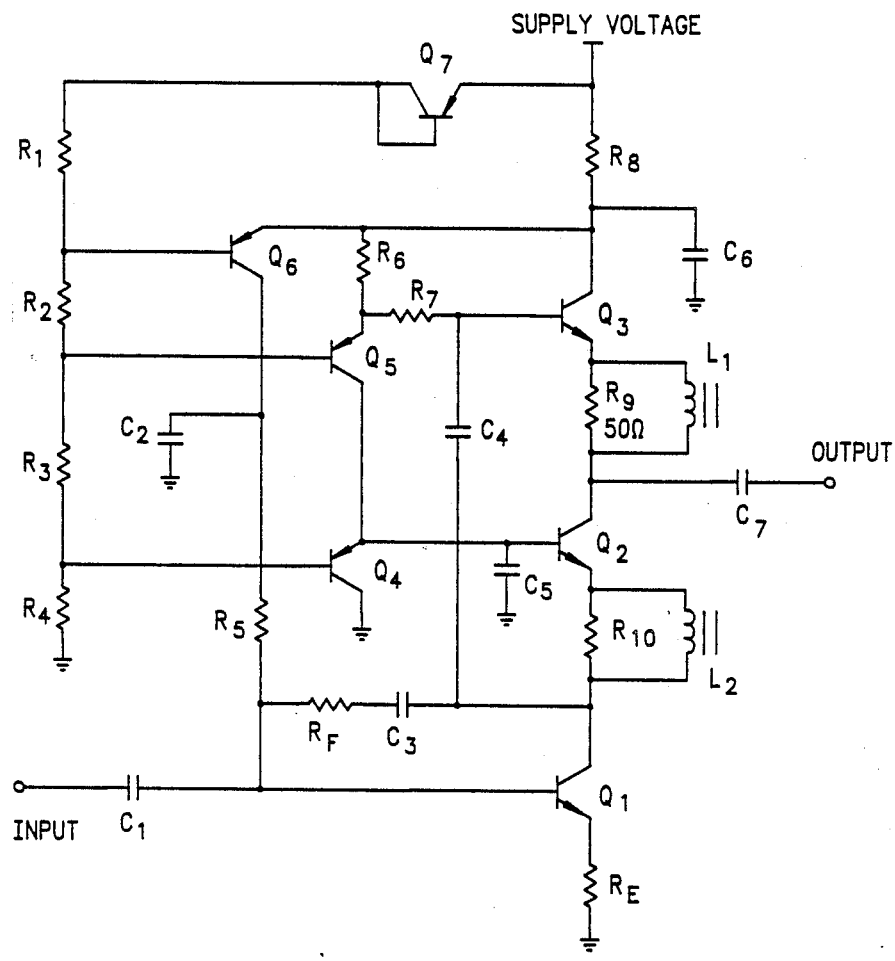
FIG. 7 is a circuit schematic of a second embodiment of the present invention.

To increase the voltage swing available from this circuit, inductive chokes $L_1$ and $L_2$ can be added to this circuit, as shown in FIG. 7. Placement of choke $L_1$ across resistor $R_9$ and choke $L_2$ across resistor $R_{10}$ will eliminate the DC voltage drop across these resistors due to the DC bias current. The additional voltage will then be spread among the three transistors $Q_1$-$Q_3$.

Although the present invention has been shown and described with respect to preferred embodiments, various changes and modifications which are obvious to a person skilled in the art to which the invention pertains are deemed to lie within the spirit and scope of the invention.

What is claimed is:

1. A broadband amplifier comprising a common emitter stage, a common base stage, a common collector stage, and biasing means, wherein the common emitter stage is connected in a cascode configuration to the common base stage, and the common collector stage is connected to the cascode configuration so as to be driven by the common emitter stage in a push-pull configuration with the common base stage.

2. An amplifier according to claim 1, wherein:
   (a) the common emitter stage comprises a first transistor having base, collector, and emitter connected in a common emitter configuration, and a resistive feedback loop connected from the first transistor collector to the first transistor base;
   (b) the common base stage comprises a second transistor having base, collector, and emitter connected in a common base configuration, and a first resistor connected from the second transistor emitter to the first transistor collector; and
   (c) the common collector stage comprises a third transistor having base, collector, and emitter connected in a common collector configuration, with its base connected to the collector of the first transistor, and a second resistor connected from the third transistor emitter to the second transistor collector.

3. An amplifier according to claim 2, wherein the second resistor has a resistance of 50 ohms.

4. An amplifier according to claim 3, wherein the first resistor has a resistance of 50 ohms.

5. An amplifier according to claim 3, wherein the first resistor has a resistance greater than 50 ohms.

6. An amplifier according to claim 2, further comprising a first inductive choke attached in parallel with the first resistor and a second inductive choke attached in parallel with the second resistor.

7. A broadband RF amplifier comprising:
   (a) an input terminal;
   (b) a first transistor having base, collector, and emitter;
   (c) a first bypass capacitor connecting the input terminal to the first transistor base;
   (d) a first resistor connecting the first transistor emitter to ground;
   (e) shunt feedback connected from the first transistor collector to the first transistor base, said shunt feedback comprising a second bypass capacitor and a second resistor;
   (f) a second transistor having base, collector, and emitter;
   (g) a third bypass capacitor connecting the second transistor base to ground;
   (h) a third resistor connecting the second transistor emitter to the first transistor collector;
   (i) a third transistor having base, collector, and emitter;
   (j) a fourth bypass capacitor connecting the third transistor collector to ground;
   (k) a fifth bypass capacitor connecting the third transistor base to the first transistor collector;
   (l) a fourth resistor connecting the third transistor emitter to the second transistor collector;
   (m) an output terminal;
   (n) a sixth bypass capacitor connecting the output terminal to the second transistor collector; and
   (o) biasing means.

8. An amplifier according to claim 7, wherein the fourth resistor has a resistance of 50 ohms.

9. An amplifier according to claim 8, wherein the third resistor has a resistance of 50 ohms.

10. An amplifier according to claim 8, wherein the third resistor has resistance greater than 50 ohms.

11. An amplifier according to claim 7, further comprising a first inductive choke attached in parallel with the third resistor and a second inductive choke attached in parallel with the fourth resistor.

* * * * *